United States Patent [19]

Coppens et al.

[11] Patent Number: 5,445,914
[45] Date of Patent: Aug. 29, 1995

[54] METHOD FOR MAKING A LITHOGRAPHIC OFFSET PLATE BY THE SILVER SALT DIFFUSION TRANSFER PROCESS

[75] Inventors: Paul Coppens, Turnhout; Augustin Meisters, Gentbrugge; Ludovicus Vervloet, Kessel, all of Belgium

[73] Assignee: Agfa-Gevaert, N.V., Mortsel, Belgium

[21] Appl. No.: 189,702

[22] Filed: Feb. 1, 1994

[30] Foreign Application Priority Data

Feb. 9, 1993 [EP] European Pat. Off. ........ 93200339.5

[51] Int. Cl.⁶ .................... G03C 5/395; G03C 8/32; G03F 7/07
[52] U.S. Cl. .................................. 430/204; 430/244; 430/248; 430/432; 430/398; 430/463
[58] Field of Search ............... 430/204, 244, 248, 463, 430/398, 432

[56] References Cited

U.S. PATENT DOCUMENTS

| | | | |
|---|---|---|---|
| 2,199,904 | 5/1940 | Alburger | 430/452 |
| 2,321,347 | 6/1943 | Alburger | 430/453 |
| 3,167,429 | 1/1965 | Levy | 430/456 |
| 5,055,381 | 10/1991 | Abe et al. | 430/463 |
| 5,077,179 | 12/1991 | Abe et al. | 430/463 |
| 5,196,290 | 3/1993 | Coppens et al. | 430/204 |
| 5,273,858 | 12/1993 | Coppens et al. | 430/204 |

OTHER PUBLICATIONS

Battaglia et al, "Hardening fixbaths...", *Research Disclosure* No. 18,728, Nov. 1979, pp.625-626.

*Primary Examiner*—Richard L. Schilling
*Attorney, Agent, or Firm*—Breiner & Breiner

[57] ABSTRACT

The present invention provides a method for making an offset printing plate according to the silver salt diffusion transfer process using rinsing water, characterized in that alkali is added to said rinsing water before washing at most 20 m² of said exposed and developed imaging element and/or before being in use for more than 24 hours in such an amount that a pH in said washing water between 10.5 and 13 is obtained.

7 Claims, No Drawings

METHOD FOR MAKING A LITHOGRAPHIC OFFSET PLATE BY THE SILVER SALT DIFFUSION TRANSFER PROCESS

DESCRIPTION

1. Field of the invention.

The present invention relates to a method for making lithographic printing plates according to the silver salt diffusion transfer process in a more ecological and economical way.

2. Background of the invention.

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background.

The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in water-permeable relationship therewith. It is the latter mono-sheet version which is preferred for the preparation of offset printing plates by the DTR method.

Two types of the mono-sheet DTR offset printing plate exist. According to a first type disclosed in e.g. U.S. Pat. No. 4,722,535 and GB-1,241,661 a support is provided in the order given with a silver halide emulsion layer and a layer containing physical development nuclei serving as the image-receiving layer. After information-wise exposure and development the imaged element is used as a printing plate without the removal of the emulsion layer.

According to a second type of mono-sheet DTR offset printing plate a hydrophilic support, mostly anodized aluminium, is provided in the order given with a layer of physical development nuclei and a silver halide emulsion layer. After information-wise exposure and development the imaged element is washed with water to remove the emulsion layer so that a support carrying a silver image is left which is used as a printing plate. Such type of lithographic printing plate is disclosed e.g. in U.S. Pat. No. 3,511,656.

For ecological and economical reasons and for convenience it is desirable that the rinsing water can be reused to rinse as many imaged elements as possible. However when said rinsing water is used to process several imaging elements over a longer period of time the rinsing water becomes polluted i.e. by gelatine. This originates the growth of fungi and bacteria resulting in degradation of the gelatine and causing a nasty smell.

3. Summary of the invention.

It is an object of the present invention to provide an ecological, economical and convenient method for preparing a lithographic printing plate from an imaging element having a hydrophilic base.

It is a further object of the present invention to provide a method for extending the life time and the capacity of the rinsing water.

Still further objects of the present invention will become clear from the description hereinafter.

According to the present invention there is provided a method for making an offset printing plate according to the silver salt diffusion transfer process comprising the steps of:

information-wise exposing an imaging element comprising in the order given (i) a hydrophilic base, (ii) an image receiving layer containing physical development nuclei and (iii) a silver halide emulsion layer, developing said information-wise exposed imaging element using an aqueous alkaline processing solution in the presence of at least one developing agent and at least one silver halide solvent to obtain a silver image on said hydrophilic support and removing said silver halide emulsion layer and any optional layer on top of said silver image to expose said silver image by means of washing with rinsing water, characterized in that alkali is added to said rinsing water before washing at most 20 m$^2$ of said exposed and developed imaging element and/or before being in use for more than 24 hours in such an amount that a pH in said washing water between 10.5 and 13 is obtained.

4. Detailed description of the invention.

Lithographic printing plates are obtained according to the DTR-process with good printing properties and in an ecological, economical and convenient way by using rinsing water whereon alkali is added before washing at most 20 m$^2$ of said exposed and developed imaging element (hereafter called "imaged element") and/or before being in use for more than 24 hours whereby a pH between 10.5 and 13 is obtained. However the reuse of rinsing water is severely restricted when the rinsing water is not brought soon-enough to a pH of at least 10.5 due to the occurence of a nasty smell after processing a few imaged elements. Preferably the alkali to obtain said pH range is added to the rinsing water before washing 10 m$^2$ of the imaged element, more preferably the alkali is added to fresh rinsing water. Particularly preferably said rinsing wager (rinsing solution) has after the addition of alkali a pH between 11.3 and 12.

The rinsing water can be any kind of water preferably water provided by a common water supply, e.g. tap water.

The alkali can be added as such or as an aqueous solution, having preferably a pH of at least 12, more preferably a pH of around 13. Suitable compounds are such alkali-providing substances like hydroxides of sodium and potassium, alkali metal salts of phosphoric acid and/or silicic acid e.g. trisodiumphosphate, orthosilicates, metasilicates, hydrodisilicates of sodium or potassium, and sodium carbonate. The alkali-providing substances can be substituted in part or wholly by alkanolamines.

A processing solution suitable for use in the DTR-process is essentially an-aqueous alkaline solution having a pH of preferably at least 12, more preferably of at least 13, containing more or less optionally a number of ingredients as disclosed in hereafter. In a preferred way said processing solution is used as the alkaline solution and is added in an amount between 2% and 9% by volume to the rinsing water, more preferably in an amount between 5% and 7% by volume to the rinsing water.

To further improve the life time of said rinsing water the pH of said rinsing water can be kept during its further use between 10.5 and 13, more preferably between 11.3 and 12 by adding further amounts of alkali. The amounts of alkali needed and the moments when added are dependent on a number of parameters such as the quantity of rinsed imaged element, the amount and the alkalinity of the liquid transferred from the processing section to the washing section and from the washing section to the following section. The addition of the alkali can be executed in a more or less continuous way by e.g. continuously measuring the pH of the rinsing water and adding alkali whenever the pH deviates from the imposed value.

In a more preferred embodiment, the addition of the alkali is executed in a discontinuous way whereby the pH of the washing water fluctuates between more or less broad limits, however still within the required ranges. So the addition of alkali may be executed each time after rinsing a fixed quantity of imaged element, the amount of alkali and the quantity of rinsed imaged element being experimentally defined and being very much the result of the apparatus used in preparing the lithographic plate.

To further prolong the time that said rinsing water can be reused, said rinsing water can be warmed up at least once each day that at least 10 m² of the imaged element is washed to a temperature of at least 50° C. for at least 15 minutes, more preferably to a temperature between 60° C. and 67° C. for 0.5 to 1 hour. This operating procedure can be used as an alternative to the previous one or in combination therewith.

From an economical point of view, it is interesting that each step in the preparation of the lithographic printing plate proceeds as fast as possible. It has been found that with a rinsing solution suitable for use in the present invention, a washing time between 4 and 30 seconds, preferably between 5 and 15 seconds gives good results with regard to the removal of said silver halide emulsion layer and any optional layer on top of said silver image and to the printing properties of the obtained lithographic plate.

The imaging element is preferably prepared by coating the different layers on a hydrophilic base. Alternatively the different layers may be laminated to said image receiving layer from a temporary base holding the layers in reverse order as disclosed in U.S. Pat. No. 5,068,165.

The hydrophilic base can be a hardened hydrophilic layer, containing a hydrophilic synthetic homopolymer or copolymer and being hardened with a hydrolyzed tetraalkyl orthosilicate crosslinking agent coated on a flexible hydrophobic support. More preferably the hydrophilic base is an aluminium support.

The aluminium support of the imaging element for use in accordance with the present invention can be made of pure aluminium or of an aluminium alloy, the aluminium content of which is at least 95%. The thickness of the support usually ranges from about 0.13 to about 0.50 mm.

The preparation of aluminium foils or aluminium alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results. Preferably the aluminium foil has a roughness with a CLA value between 0.2 and 1.5 $\mu$m, an anodization layer with a thickness between 0.4 and 2.0 $\mu$m and is sealed with an aqueous bicarbonate solution.

The graining, anodizing, and sealing of the aluminium foil can be performed as described in e.g. in EP-A 567.178, U.S. Pat. No. 3,861,917 and in the documents referred to therein.

The image receiving layer for use in accordance with the present invention is preferably free of hydrophilic binder but may comprise small amounts up to 30% by weight of the total weight of said layer of a hydrophilic colloid e.g. polyvinyl alcohol to improve the hydrophilicity of the layer.

Preferred development nuclei for use in accordance with the present invention are sulphides of heavy metals e.g. sulphides of nickel, palladium, platinum, silver, and zinc.

The imaging element preferably also comprises an intermediate water swellable layer between the layer of physical development nuclei and any subsequent layers to facilitate the removal of said layers as disclosed in EP-A-519,123. Examples of suitable intermediate layers are e.g. a layer comprising a non-proteinic hydrophilic film forming polymer e.g. polyvinyl alcohol as disclosed in EP-A-410,500, a layer comprising water swellable polymer beads e.g. polymethyl methacrylate beads as disclosed in EP-A-483,415 or a layer comprising a mixture of polymer beads and a non-proteinic film forming polymer.

The silver halide emulsion layer can be any photosensitive silver halide emulsion comprising a hydrophilic colloid binder.

The photographic silver halide emulsion(s) for coating silver halide emulsion layers for use in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The silver halide emulsion or emulsions for use according to the present invention preferably consist principally of silver chloride while a fraction of silver bromide may be present ranging from 1 mole % to 40 mole %. The silver halide emulsions preferably belong to the core/shell type well known to those skilled in the art in the sense that substantially all the bromide is concentrated in the core. This core contains preferably 10 to 40% of the total silver halide precipitated, while the shell consists preferably of 60 to 90 of the total silver halide precipitated. Most preferably a silver halide emulsion containing at least 70 mole % of silver chloride is used.

The average size of the silver halide grains may range from 0.10 to 0.70 pan, preferably from 0.25 to 0.45.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$.

The silver halide emulsions can be chemically sensitized. A method of chemical sensitization has been described in the article of R. KOSLOWSKY, Z. Wiss. Photogr. Photophys. Photochem. 46, 65–72 (1951).

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons.

The spectral photosensitivity of the silver halide can also be adjusted for exposure by laser light e.g. helium-neon laser light, argon laser light, and solid state laser light. Dyes that can be used for adjusting the photosensitivity to laser light have been described in numerous disclosures.

More details about the composition, preparation and coating of silver halide emulsions can be found in e.g. Product Licensing Index, Vol. 92, December 1971, publication 9232, p. 107–109.

The silver halide emulsions may comprise other ingredients e.g. antifogging agents, developers and/or development accelerators, wetting agents, and hardeners. Optionally, the silver halide emulsions may comprise matting agents or spacing agents e.g. finely divided silica particles and polymer beads as described U.S. Pat. No. 4,614,708, to promote an effective vacuum suction of the photosensitive material in vacuum contact exposure units.

As binder in the silver halide emulsion layer(s) in connection with the present invention a hydrophilic colloid may bemused, usually a protein, preferably gelatin. Gelatin can, however, be replaced in part or integrally by synthetic, semi-synthetic, or natural polymers.

The imaging element used in accordance with the present invention is exposed in an apparatus according to its particular application, e.g. a conventional process camera containing a conventional light source or a laser containing device.

The development and diffusion transfer of the information-wise exposed imaging element are effected with the aid of an aqueous alkaline solution in the presence of at least one developing agent and at least one silver halide solvent said alkaline solution preferably comprising a silver halide solvent. The developing agent(s) and/or the silver halide solvent(s) can be incorporated in the aqueous alkaline solution and/or in the imaging element itself e.g. in at least one silver halide emulsion layer and/or in a water-swellable layer or in a supplemental hydrophilic colloid layer in water-permeable relationship with the silver halide emulsion layer(s).

The silver halide solvent can also be incorporated at least in part in the physical development nuclei containing layer. When the aqueous alkaline solution does not comprise the developing agent (s), it is merely an activating liquid that is capable of dissolving the developing agent(s) contained in one of the layers.

Suitable developing agents for use in accordance with the present invention are a hydroquinone-type compound in combination with a secondary developing agent of the class of 1-phenyl-3-pyrazolidinone compounds and p-N-methyl-aminophenol. Particularly useful 1-phenyl-3-pyrazolidinone developing agents are 1-phenyl-3-pyrazolidinone, 1-phenyl-4-methyl-3-pyrazolidinone, 1-phenyl-4-ethyl-5-methyl-3-pyrazolidinone, and 1-phenyl-4,4-dimethyl-3-pyrazolidinone.

The hydroquinone-type compound is e.g. hydroquinone, methyl-hydroquinone, or chlorohydroquinone. Preferred amounts of the hydroquinone-type developing agents are in the range of 0.05 mole to 0.25 mole per liter and preferred amounts of secondary developing agent(s) in the range of $1.8 \times 10^{-3}$ to $2.0 \times 10^{-2}$ mole per liter.

The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate in an amount ranging from 5 g to 20 g per liter.

Other suitable silver halide solvents are i.a. sulphites, amines and alkanolamines. Further suitable silver halide-solvents are polythioethers as disclosed in U.S. Pat. No. 5,200,294 and meso-ionic compounds as disclosed in EP-A-554.585.

Combinations of different silver halide solvents can be used and it is also possible to incorporate at least one silver halide solvent into a suitable layer and add at least one other silver halide solvent to the developing solution.

Suitable combinations of different silver halide solvents are a combination of (an) alkanolamine(s) and a thiosulfate wherein said thiosulfate is used in a total amount between 0.01% and 1% by weight in said alkaline processing liquid as disclosed in EP-A 549.831.

Combinations of at least one silver halide solvent and a regulator may also be used. Suitable regulators are disclosed in EP-A 547.660 and in EP-A 92201997.1.

The quantitative ranges given for the developing agents, silver halide solvents, and sulphite apply to the amount of these compounds present as solutes in the aqueous alkaline solution during the DTR-processing, whether these compounds make part of the aqueous alkaline solution, which in that particular case actually is an aqueous alkaline developing solution, or were dissolved from the layers containing them upon application thereto of the aqueous alkaline solution, in which case it is an activating solution.

The aqueous alkaline solution in accordance with the present invention may further comprise sulphite e.g. sodium. sulphite in an amount ranging from 40 g to 180 g per liter, preferably from 60 to 160 g per liter in combination with another silver halide solvent, preferably a water soluble thiosulphate and/or thiocyanate.

The aqueous alkaline solution suitable for use according to the present invention preferably comprises aluminium ions in an amount of at least 0.3 g/l, more preferably in an amount of at least 0.6 g/l in order to prevent sticking of the emulsion layer to the transporting rollers when the emulsion is swollen with the aqueous alkaline solution.

The pH of the aqueous alkaline solution is preferably at least 12, but depends on the type of silver halide emulsion material to be developed, intended development time, and processing temperature.

The processing conditions such as temperature and time may vary within broad ranges provided the mechanical strength of the materials to be processed is not adversely influenced-and no decomposition takes place.

The aqueous alkaline solution may comprise such alkali-providing substances like hydroxides of sodium and potassium, alkali metal salts of phosphoric acid and/or silicic acid e.g. trisodium phosphate, orthosilicates, metasilicates, hydrodisilicates of sodium or potassium, and sodium carbonate. The alkali-providing substances can be substituted in part or wholly by alkanolamines.

The aqueous alkaline solution may further comprise silver-image hydrophobizing compounds e.g. heterocyclic mercapto compounds. The addition of heterocyclic mercapto compounds more particularly a mercapto-1,3,4-thiadiazole to a developing liquid for the purpose of hydrophobizing the silver image formed according to the DTR-process on a hydrophilic base has been described already in DE-A 1,228,927. Other suitable mercapto-thiadiazoles that can be added to the aqueous alkaline solution have been disclosed in U.S. Pat. No. 4,563,410. Another suitable hydrophobizing compound is 2-mercapto-5-heptyl-oxa-3,4-diazole.

These hydrophobizing compounds can be added to the aqueous alkaline solution in an amount of preferably 0.1 to 3 g per liter and preferably in admixture with 1-phenyl-5-mercaptotetrazole, the latter compound may be used in amounts of e.g. 50 mg to 1.2 g per liter of solution, which may contain a minor amount of ethanol to improve the dissolution of said compounds.

The aqueous alkaline solution may comprise other ingredients such as e.g. oxidation preservatives, a compound releasing bromide ions, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range of 5 to 6.

Bufferred stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. They are normally carried out at a temperature in the range of 18° C. to 30° C.

After formation of the silver image on the hydrophilic base an excess of alkaline solution still present on the base may be eliminated, preferably by guiding the foil through a pair of squeezing rollers.

The silver image thus obtained in the layer of physical development nuclei is subsequently exposed by washing off all the layers above the layer containing physical development nuclei with rinsing water in accordance with the present invention.

The temperature of the rinsing water may be varied widely but is preferably between 20° C. and 45° C.

The imaged surface of the lithographic base can be subjected to a chemical treatment that increases the hydrophilicity of the non-silver image parts and the oleophilicity of the silver image.

This chemical after-treatment is preferably carried out with a lithographic composition often called fixer, which comprises at least one compound enhancing the ink-receptivity and/or lacquer-receptivity of the silver image, and also comprises at least one compound that improves the ink-repelling characteristics of the hydrophilic base.

Suitable ingredients for the fixer are e.g. organic compounds containing a mercapto group such as the hydrophobizing compounds referred to hereinbefore for the alkaline solution and compounds corresponding to one of the following formulas:

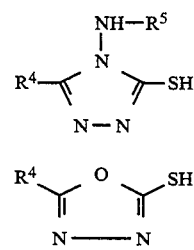

wherein $R^5$ represents hydrogen or an acyl group, $R^4$ represents alkyl, aryl or aralkyl.

A suitable fixer as disclosed in U.S. Pat. No. 4.563.410 is a composition comprising a solution of a mercapto-triazole in a solution of polyethylene oxide with a molecular weight of 4,000. Further suitable fixers have been described in i.a. U.S. Pat. No. 4,062,682.

In general, the treatment with the fixer does not take long, usually not longer than about 30 seconds and it may be carried out immediately after the processing and uncovering steps.

The fixer can be applied in different ways. The image-hydrophobizing step of the printing plate may also proceed automatically by conducting the printing plate through a device having a narrow channel filled with the fixer and conveying the printing plate at the end of the channel between two squeezing rollers removing the excess of liquid.

As soon as the hydrophilic base carrying the silver image has been treated with the fixer, it is ready to be used as a printing plate.

The following examples illustrate the present invention without however, limiting it thereto. All parts, percentages and ratios are by weight unless otherwise indicated.

EXAMPLE 1 ( comparative example )

An imaging element I was obtained by coating a grained, anodized and sealed aluminium support with a silver-receptive stratum containing 0.7 mg/m² PdS as physical development nuclei.

An intermediate layer was then provided on the dry silver-receptive stratum from an aqueous composition in such a way that the resulting dried layer had a weight of 0.5 g of polymethyl methacrylate beads per m², said composition comprising:

| | |
|---|---|
| a 20% dispersion of polymethyl methacrylate beads in a mixture of equal volumes of water and ethanol having an average diameter of 1.0 μm | 50 ml |

-continued

| | |
|---|---|
| Helioechtpapierrot BL (trade mark for a dye sold by BAYER AG, D-5090 Leverkusen, West-Germany) | 2.5 g |
| saponine | 2.5 g |
| sodium oleylmethyltauride | 1.25 g |
| demineralized water | 300 ml |
| (pH-value: 5.6) | |

Subsequently a substantially unhardened photosensitive negative-working cadmium-free gelatin silver chlorobromoiodide emulsion layer (97.98/2/0.02 mol %) was coated on the intermediate layer, the silver halide being provided in an amount corresponding to 2.40 g of silver nitrate per $m^2$ and the gelatin content of the emulsion layer being 1.58 $g/m^2$.

Finally the imaging element was cut in sheets.

The imaging sheets were identically exposed through a contact screen in a process-camera and immersed for 8 s at 24° C. in a freshly made developing solution having the following ingredients:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-3-pyrazolidinone | 6 g |
| potassium bromide | 0.75 g |
| anhydrous sodium thiosulphate | 8 g |
| ethylene dismine tetraacetic acid tetrasodium salt | 2 g |
| demineralized water to make | 1000 ml |
| pH (24° C.) = 13 | |

The initiated diffusion transfer was allowed to continue for 30 s to form a silver image in the image receiving layers.

To remove the developed silver halide emulsion layer and the intermediate layer from the aluminium foil the developed monosheet DTR materials were rinsed for 6 s with a water jet at 40° C. The water jet was fed with water from a rinsing tank, containing 10 l of tap water at the start of the experiment and whereto the used rinsing water was drained.

The handling of the imaging elements proceeded in a continuous way in units of 10 $m^2$ (processing time 30 minutes). Between each unit, there was an interval of 30 minutes.

After washing the quantities of imaged element as indicated in table 1, there was taken a small sample of the rinsing water, whereto can be added alkali to a pH of 12.5. After storing the air-tight closed samples at 20° C. for the indicated period of time, the smell of these solutions was controlled.

TABLE 1

| | developing | | smell[a] | | |
|---|---|---|---|---|---|
| $m^2$ washed | solut. added | pH | 3 days | 7 days | 14 days |
| 0 | N | 7.4 | 0 | 0 | 0 |
| | Y | 12.3 | 0 | 0 | 0 |
| 5 | N | 9.3 | 0 | 0 | 1 |
| | Y | 11.5 | 0 | 0 | 0 |
| 10 | N | 9.4 | 0 | 2 | 4 |
| | Y | 11.4 | 0 | 0 | 0 |
| 15 | N | 9.5 | 1 | 4 | 5 |
| | Y | 11.2 | 0 | 0 | 0 |
| 20 | N | 9.5 | 2 | 5 | 5 |
| | Y | 11.1 | 0 | 0 | 0 |
| 5 | N | | | | |

TABLE 1-continued

| | developing | | smell[a] | | |
|---|---|---|---|---|---|
| $m^2$ washed | solut. added | pH | 3 days | 7 days | 14 days |
| | Y | | | | |

[a]The smell is evaluated on a relative scale from 0 to 5:
0: no smell
1: very light smell
2: light smell
3: smell
4: nasty smell
5: very nasty smell This table clearly shows that the addition of alkali to the rinsing water to a pH of 12.5 prevents the occurence of a (nasty) smell of this rinsing water even after washing 20 $m^2$ of imaged element and standing for 14 days. When no alkali was added a (nasty) smell originates all the sooner when more imaged element was washed.

EXAMPLE 2

Sheets of the imaging element I were obtained, exposed, developed and washed in a continuous way in units of 10 $m^2$ as described in example 1. However, there was added developing solution to the fresh rinsing solution in an amount of 2% by volume. After washing the quantity of imaged element as given in table 2, there was taken a small sample of the rinsing water. After storing the air-tight closed samples at 20° C. for the indicated period of time, the smell of these solutions was controlled. The results are given in table 2

TABLE 2

| $m^2$ washed | pH | smell[a] | | |
|---|---|---|---|---|
| | | 3 days | 7 days | 14 days |
| 0 | 11.6 | 0 | 0 | 0 |
| 10 | 10.5 | 0 | 0 | 2 |
| 20 | 10.5 | 0 | 1 | 3 |
| 30 | 10.4 | 0 | 2 | 4 |
| 40 | 10.4 | 0 | 3 | 5 |
| 50 | 10.3 | 1 | 3 | 5 |

[a]The smell is evaluated as described for Table 1.

It is clear from these results that the occurence of a nasty smell of the washing water (what determines its practical time for use) as a function of the quantity of washed imaged element and the keeping time of said washing water is already substantially retarded by adding developing solution to the fresh rinsing solution in an amount of 2% by volume in accordance with the invention. Indeed, as mentioned in example 1, washing water wherein 10 $m^2$ respectively 20 $m^2$ is treated smells already after 7 respectively 3 days and has a very nasty smell after 14 respectively 7 days. When not adding furtheron developing solution to a rinsing solution wherein at least 30 $m^2$ has been treated there still will originate a smell after storing said rinsing solution for 8 days, which becomes (very) nasty after storing the rinsing solution for 14 days.

EXAMPLE 3

Sheets of the imaging element I were made, exposed, developed and washed according to the procedure described in example 1. However there was added developing solution to the fresh rinsing solution in an amount of 5% by volume. The first 2 days a quantity of 50 $m^2$ was handled and the third day a quantity of 30 $m^2$. After washing the quantity of imaged element as given in table 3, there was taken a small sample of the rinsing water. After storing the air-tight closed samples at 20° C. for the indicated period of time, the smell of these solutions was controlled. The results are given in table 3

TABLE 3

| m² washed | pH | smell[a] | | |
|---|---|---|---|---|
| | | 3 days | 7 days | 14 days |
| 0 | 12 | 0 | 0 | 0 |
| 30 | 10.5 | 0 | 0 | 0 |
| 50 | 10.5 | 0 | 0 | 0 |
| 100 | 10.4 | 0 | 0 | 0 |
| 130 | 10 | 0 | 0 | 0 |

[a] The smell is evaluated as described for Table 1.

After every 10 m² a washed plate is taken apart. Next, the imaged surface of these 13 aluminium foils was rubbed with a fixer having the composition shown below to enhance the water-receptivity of the non-image areas and to make the image areas oleophilic ink-receptive. The fixer had the following composition:

| | |
|---|---|
| 10% aqueous n-hexadecyl trimethyl ammonium chloride | 25 ml |
| 20% aqueous solution of polystyrene sulphonic acid | 100 ml |
| potassium nitrate | 12.5 g |
| citric acid | 20.0 g |
| 1-phenyl-5-mercaptotetrazole | 2.0 g |
| 2-mercapto-5-n.heptyl-oxa-3,4-diazole | 200 mg |
| sodium hydroxide | 5.5 g |
| water to make | 1000 ml |
| pH (20° C.) = 4 | |

The printing plates thus prepared were mounted on the same offset printing machine (HEIDELBERG GTO-46) and were used for printing under identical conditions. Commercial AQUA. TAME 7035E, marketed by Anchor/Lithemko Inc., Fla., was used at a 5% concentration in an aqueous solution containing 10% isopropanol as dampening solution and K+E 125, marketed by Kast+Ehinger, A. G., Germany, was used as ink. A compressible rubber blanket was used.

All printing plates gave the same excellent copies. A very high printing endurance (>100.000 copies) was obtained and the small raster point were still clearly reproduced.

It is clear from these results that the occurence of a (nasty) smell of the washing water (what determines its practical time for use) as a function of the quantity of washed imaged element and the keeping time of said washing water is most strongly retarded by adding developing solution to the fresh rinsing solution in an amount of 5% by volume in accordance with the invention, even when not adding furtheron developing solution or when the pH of the washing water falls below 10.5 without deteriorating the printing properties of the obtained lithographic plates.

We claim:

1. A method for making an offset printing plate according to the silver salt diffusion transfer process comprising the steps of:

information-wise exposing an imaging element comprising in the order given (i) a hydrophilic base, (ii) an image receiving layer containing physical development nuclei and (iii) a silver halide emulsion layer, developing said information-wise exposed imaging element using an aqueous alkaline processing solution in the presence of at least one developing agent and at least one silver halide solvent to obtain a silver image on said hydrophilic support and removing said silver halide emulsion layer and any optional layer on top of said silver image to expose said silver image by means of washing with rinsing water, characterized in that said rinsing water is obtained by adding to fresh rinsing water processing solution in an amount between 2% and 9% by volume of said fresh rinsing water, said rinsing water thereby obtaining a pH between 10.5 to 13.

2. A method according to claim 1 wherein the processing solution is added in an amount between 5% and 7% by volume to the rinsing water.

3. A method according to claim 1 wherein said processing solution comprises aluminium ions in an amount of at least 0.3 g/l.

4. A method according to claim 1 wherein said rinsing water is warmed up to a temperature of at least 50° C. for at least 15 minutes at least once each day that at least 10 m² of the imaged element is washed.

5. A method according to claim 1 wherein the pH of said rinsing water is kept during its further use between 11.3 and 12 by adding alkali.

6. A method according to claim 1 wherein the washing time is comprised between 4 and 30 seconds.

7. A method according to claim 1 wherein the washing time is comprised between 5 and 15 seconds.

* * * * *